(12) United States Patent
Doan et al.

(10) Patent No.: US 6,303,953 B1
(45) Date of Patent: Oct. 16, 2001

(54) INTEGRATED CAPACITOR BOTTOM ELECTRODE WITH ETCH STOP LAYER

(75) Inventors: Trung T. Doan; Thomas A. Figura, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/239,599

(22) Filed: Jan. 29, 1999

Related U.S. Application Data

(62) Division of application No. 08/916,103, filed on Aug. 21, 1997, now Pat. No. 6,048,763.

(51) Int. Cl.⁷ .................................................. H01L 29/72
(52) U.S. Cl. ...................... 257/296; 257/301; 257/309; 257/532
(58) Field of Search .................................. 257/296, 301, 257/309, 532

(56) References Cited

U.S. PATENT DOCUMENTS

| Re. 35,420 | 1/1997 | Cathey et al. . |
|---|---|---|
| 4,257,832 | 3/1981 | Schwabe et al. . |
| 4,481,283 | 11/1984 | Kerr et al. . |
| 4,764,248 | 8/1988 | Bhattacherjee et al. . |
| 4,821,085 | 4/1989 | Haken et al. . |
| 4,824,797 | 4/1989 | Goth . |
| 4,874,719 | 10/1989 | Kurosawa . |
| 4,939,105 | 7/1990 | Langley . |
| 4,994,402 | 2/1991 | Chiu . |
| 4,996,081 | 2/1991 | Ellul et al. . |
| 5,006,481 | 4/1991 | Chan et al. . |
| 5,032,233 | 7/1991 | Yu et al. . |
| 5,037,773 | 8/1991 | Lee et al. . |
| 5,043,780 | 8/1991 | Fazan et al. . |
| 5,053,351 | 10/1991 | Fazan et al. . |
| 5,053,917 | 10/1991 | Miyasaka et al. . |
| 5,057,888 | 10/1991 | Fazan et al. . |

(List continued on next page.)

FOREIGN PATENT DOCUMENTS 4-99317  3/1992  (JP) .

OTHER PUBLICATIONS

Sakai, et al., *Applied Physics Letter*, Appl. Phys. Lett 61 (2), "Novel Seeding Method for the Growth of Polycrystalline SI films with Hemispherical Grains," pp. 158–161, Jul. 13, 1992.

Watanabe, et al., *IEEE Transactions in Electron Devices*, vol. 42, No. 2, Feb. 1995, "An Advanced Technique for Fabricating Hemispherical–Gained (HSG) Silicon Storage Electrodes".

Primary Examiner—Edward Wojciechowicz
(74) Attorney, Agent, or Firm—Knobbe, Martens, Olson & Bear, LLP (57) ABSTRACT

A process of forming a capacitor on a surface of a wafer having one or more word lines and an active area adjacent the word lines. The word lines are isolated from the active areas by isolation spacers. The process comprises the steps of forming a multilayer structure over the word lines and the active area, selectively removing a portion of the multilayer structure to expose active area and to form a capacitor container region above the active area and sequentially depositing the bottom electrode, the cell dielectric and the upper electrode of the capacitor. The multilayer structure comprises a conformal etch stop layer, a sacrificial layer and a mask layer. The etch stop layer protects the active area and word line spacers during a selective etch of the sacrificial layer, and the etch stop layer may then be removed with minimal damage to the gate electrode spacers. In the preferred embodiment, the process requires only two masking steps to form a fully isolated, high-surface area capacitor for a DRAM cell.

6 Claims, 6 Drawing Sheets

U.S. PATENT DOCUMENTS

| | | |
|---|---|---|
| 5,082,797 | 1/1992 | Chan et al. . |
| 5,089,986 | 2/1992 | Sandhu et al. . |
| 5,094,712 | 3/1992 | Becker et al. . |
| 5,102,832 | 4/1992 | Tuttle . |
| 5,112,773 | 5/1992 | Tuttle . |
| 5,130,885 | 7/1992 | Fazan et al. . |
| 5,138,411 | 8/1992 | Sandhu . |
| 5,139,967 | 8/1992 | Sandhu et al. . |
| 5,159,428 | 10/1992 | Rao et al. . |
| 5,160,408 | 11/1992 | Long . |
| 5,169,491 | 12/1992 | Doan . |
| 5,177,303 | 1/1993 | Lee et al. . |
| 5,187,638 | 2/1993 | Sandhu et al. . |
| 5,191,509 * | 3/1993 | Wen ........................................ 257/296 |
| 5,208,176 | 5/1993 | Ahmad et al. . |
| 5,217,926 | 6/1993 | Langley . |
| 5,229,331 | 7/1993 | Doan et al. . |
| 5,234,855 | 8/1993 | Rhodes et al. . |
| 5,236,860 | 8/1993 | Fazan et al. . |
| 5,262,343 | 11/1993 | Rhodes et al. . |
| 5,266,514 | 11/1993 | Tuan et al. . |
| 5,278,091 | 1/1994 | Fazan et al. . |
| 5,278,098 | 1/1994 | Wei et al. . |
| 5,286,344 | 2/1994 | Blalock et al. . |
| 5,292,677 | 3/1994 | Dennison . |
| 5,298,451 | 3/1994 | Rao . |
| 5,298,463 | 3/1994 | Sandhu et al. . |
| 5,300,463 | 4/1994 | Cathey et al. . |
| 5,302,233 | 4/1994 | Kim et al. . |
| 5,306,951 | 4/1994 | Lee et al. . |
| 5,309,023 | 5/1994 | Motonami et al. . |
| 5,318,920 | 6/1994 | Hayashide . |
| 5,326,714 | 7/1994 | Liu et al. . |
| 5,340,763 | 8/1994 | Dennison . |
| 5,340,765 | 8/1994 | Dennison et al. . |
| 5,344,525 | 9/1994 | Cathey, Jr. . |
| 5,358,892 | 10/1994 | Rolfson . |
| 5,362,666 | 11/1994 | Dennison . |
| 5,366,590 | 11/1994 | Kadomura . |
| 5,366,917 | 11/1994 | Watanabe et al. . |
| 5,369,051 | 11/1994 | Rao et al. . |
| 5,405,801 | 4/1995 | Han et al. . |
| 5,407,534 | 4/1995 | Thakur . |
| 5,418,180 | 5/1995 | Brown . |
| 5,420,074 | 5/1995 | Ohshima . |
| 5,420,449 | 5/1995 | Oji . |
| 5,444,013 * | 8/1995 | Akram et al. ........................ 257/296 |
| 5,461,254 | 10/1995 | Tsai et al. . |
| 5,480,814 | 1/1996 | Wuu et al. . |
| 5,489,544 | 2/1996 | Rajeevakumar . |
| 5,494,841 | 2/1996 | Dennison et al. . |
| 5,505,816 | 4/1996 | Barnes et al. . |
| 5,554,557 | 9/1996 | Kuh . |
| 5,595,928 | 1/1997 | Lu et al. . |
| 5,612,558 | 3/1997 | Harshfield . |
| 5,639,685 | 6/1997 | Zahurak et al. . |
| 5,658,381 | 8/1997 | Thakur et al. . |
| 5,700,349 | 12/1997 | Tsukamoto et al. . |
| 5,700,708 * | 12/1997 | Chen et al. ......................... 257/296 |
| 5,710,067 | 1/1998 | Foote et al. . |

* cited by examiner

INTEGRATED CAPACITOR BOTTOM ELECTRODE WITH ETCH STOP LAYER

REFERENCE TO RELATED APPLICATION

This application is a divisional application of U.S. patent application Ser. No. 08/916,103, filed Aug. 21, 1997, now U.S. Pat. No. 6,048,763.

BACKGROUND OF THE INVENTION

1. Field of the Invention

The present invention relates generally to integrated semiconductor memory devices, and more particularly, to techniques for fabricating and designing charge storage capacitors in Dynamic Random Access Memory arrays.

2. Description of the Related Art

A dynamic random access memory (DRAM) cell is made from a silicon wafer using state-of-the-art semiconductor processing techniques. Typically, a DRAM cell comprises a charge storage capacitor coupled to an access device such as a field effect transistor (FET). The FET functions to charge or discharge the capacitor, thus affecting the logical state defined by the stored charge.

In the continuing trend to higher memory capacity, the packing density of capacitors (storage cells) must increase, yet each will maintain required capacitance levels. This is a crucial demand of DRAM fabrication technologies if future generations of expanded memory array devices are to be successfully manufactured.

One method of maintaining as well as increasing total charge storing capacity in densely packed memory devices is through the use of stacked capacitor cell (STC) design. In general, a stacked capacitor structure can be manufactured by sequential deposition of capacitor members over the gates of the FET device, e.g., DRAM word lines, and over the active areas where the electrical connection between the access device and the capacitor occurs. The capacitor structure generally includes a lower conductive layer (storage plate), an insulator layer and an upper conductive layer (reference plate). The upper conductive layer and the lower conductive layer are conventionally made of polysilicon material. The insulator may be made of oxide, silicon nitride, ONO or other dielectric layers interposed between the capacitor plates. In conventional stacked capacitor structures, a polysilicon plug (poly plug) is generally formed to provide an electrical connection between the capacitor structure and the active area. Thus, to prevent any current leakage between the poly plug and the gate electrode, the gate electrode must be effectively isolated by the sidewall spacers and top spacers. To provide adequate etch selectivity, as will be described below, silicon nitride is commonly used as the insulating spacer material. In this respect, the poly plug fills the gap between the nitride sidewall spacers of the transistor gates or word lines on either side of the active area.

In stacked capacitor designs, the capacitor should cover nearly the entire area of a cell and vertical portions of the cell, such that a large bottom electrode surface area contributes to the total charge storing capacity of the cell. A process that permits the fabrication of a storage node contact and the cell itself requires the use of various masking and etching steps. Conventionally, a relatively thick insulating layer must be provided. As thick silicon nitride layers generally introduce excessive stress to the wafer, the insulating layer generally comprises an oxide such as borophosphosilicate glass (BPSG). Contact openings are etched through the oxide and expose the poly plug or active areas. Mask materials serve to protect surrounding devices from the unwanted effects of both the depositing materials and the etchants used. However, considering the minute size of these contact openings, this is not an easy task in the semiconductor industry.

In the past, using conventional lithographic techniques, mask alignment tolerances and the deposition processes have significantly limited both the degree of simplification and the degree of size reduction in DRAM applications. Nevertheless, once the potential advantages of self-aligned fabrication techniques are realized by the semiconductor industry, limitations caused by mask alignment tolerances are generally overcome. It is understood that commonly used materials, such as silicon nitride, silicon oxide, silicon, polysilicon and photoresist, all have different etch removal rates when exposed to various etchants. Self-aligned processing techniques use the selective etchability of the different layers to align and form desired openings in the masking layers to thereby expose the contact regions.

In capacitor fabrication, a selective etching process is used to etch a contact opening through the insulating layer (usually oxide). Since the active areas are located between the word lines (gates), the etch process should be selective with respect to sidewall spacers of the gates, such that the opening defined by the mask may be wider than the intergate spacing without harming the gates. Specifically, the spacer has a slower etch rate than the masking material so that the opening can be defined by using an etchant that will quickly remove the oxide without etching much of the spacer. Hence, the photoresist pattern that is used to define the contact opening need not be precisely aligned in the process. Consequently, the self aligning process is very attractive for ULSI applications where small device dimensions require very tight photolithographic tolerances.

However, as the dimensions of individual memory cells in a DRAM array continue to shrink, the efficiency and the reliability of the conventional self aligned processes have dramatically decreased. With these smaller spaces, the chances for leakage between the contacts, transistors and capacitor components has increased.

One of the problems with the conventional self aligned process is the requirement of using a spacer material which is resistant to etchants which attack the insulating layer. As discussed above, the spacers not only protect the polysilicon gate from the etchants, they also provide electrical isolation between the gate and the contact region. Therefore, with such small device dimensions, even a small amount of damage to the spacers can increase the likelihood of an electrical short between the gate electrode and the conductive polysilicon-plug. Accordingly, conventional self-aligned technology strictly depends on the selectivity with which the materials may be etched. As previously mentioned, silicon oxide is the most common insulating material for isolating devices in an integrated circuit. As oxide may be selectively etched against silicon nitride, nitride has been generally preferred for gate spacers. In fact, the prevalence of conventional self-aligned contacts through silicon oxide has made nitride practically irreplaceable for spacer structures in prior art processes.

However, the reliance of conventional processing upon the selectivity of etching against the spacers results in some etching even into nitride spacers, since it is difficult to select against both the nitride spacers and the silicon substrate. Furthermore, the differential height of the contact over the spacers and over the substrate leads to overetching into the nitride spacers. Such damage leads to shorting problems, especially as device dimensions continue to shrink.

Furthermore, silicon oxide, for example, possesses many advantageous features over silicon nitride as a spacer material: Some of these advantages are the simplified processing and soft dielectric characteristics of the silicon. Additionally, oxide spacers induce less stress over the substrate and the neighboring gate stack layers compared to nitride spacers. As is well known in the art, nitride is a rigid and brittle material. When deposited on materials having less rigidity, the nitride increases the stress level in the neighboring materials and hence causes stress-induced defects.

Another major problem of conventional processing techniques for manufacturing capacitors is the number of photolithographic or masking steps used throughout the process. In general, three masking steps are required to manufacture a prior art capacitor. The first masking step is used to define a buried contact opening to reach the active areas. The second mask is used to define the bottom or storage electrode and the final mask defines the upper or reference electrode.

However, in today's very competitive and high volume semiconductor industry, the number of masking steps in device fabrication sets the criteria for product quality and reliability as well as manufacturing costs. It is well known in the art that reducing the number of masking steps in integrated circuit manufacturing not only reduces the manufacturing cost and time but also increases the reliability and quality of the end product, since fewer masking steps produce fewer defects. This is also true for DRAM capacitor fabrication. A process that not only permits more compact capacitor structures, i.e., self-aligned fabrication process, but also reduces the number of fabrication steps, particularly the masking steps, would be a significant advantage in the art of DRAM capacitor fabrication.

Thus, there is an increasing need in the industry for an improved contact formation in integrated capacitor fabrication process that provides the advantages of self-alignment while permitting a wide variety of materials as masking and spacer material and minimizing overetch damage into the word line or gate spacers. The process should also advantageously require fewer masking steps than prior art processes.

SUMMARY OF THE INVENTION

The aforementioned needs are satisfied by the present invention. A preferred embodiment comprises a process for fabricating a capacitor on a surface of a semiconductor substrate having one or more conductive word lines which are separated from one another by the active areas adjacent the word lines. The word lines are effectively isolated by the isolation spacers. In particular, in this process a multilayer film structure is positioned over the wafer so that a capacitor region can be formed in the multilayer structure using sequential selective etchings through a resist mask opening. The preferred process employs only two mask steps to form the capacitor bottom electrode.

Specifically, a preferred process comprises first depositing a conformal etch stop layer, such as silicon dioxide, over an active area of a semiconductor substrate, wherein the etch stop layer has a first characteristic etch rate. The etch stop layer protects the isolation spacers of the word lines and the active area from damage resulting from subsequent etch steps. A sacrificial layer, such as undoped polysilicon, is then deposited over the etch stop. The sacrificial layer has a second characteristic etch rate. The sacrificial layer forms an intermediate layer in the multilayer film structure which provides a better selectivity for the etching process, allowing the use of a wide variety of materials as the etch stop or mask material. Subsequently, a mask layer, such as a planarized borophosphosilicate glass (BPSG) layer, is deposited over the polysilicon layer.

A first photoresist layer is deposited and patterned to expose portions of the mask layer. The capacitor region is formed by selectively removing the exposed portions of the mask layer and the underlying sacrificial layer to define a contact opening. During this etch step, etchants are preferably selected to remove the mask layer and the sacrificial layer without significantly etching the etch stop layer. The etch stop layer adjacent the active area can then be removed to complete the formation of a capacitor container. In this manner, the spacers interposed between the word line conductor and the capacitor container region can be retained at their desired thickness.

The storage plate of the capacitor is formed by depositing a first conductive material layer, preferably hemispherical grain (HSG) polysilicon, over the capacitor container region, and then removing a portion of the HSG polysilicon to form a storage plate layer within the capacitor container region. In the preferred embodiment, this portion of the HSG layer is removed using chemical mechanical planarization (CMP). After the removal of the remaining portions of the BPSG and the sacrificial layer, a dielectric layer is deposited over the capacitor region to form the cell dielectric. The dielectric layer preferably comprises silicon nitride. The basic capacitor structure is completed by depositing a second conductive material layer, such as polysilicon, over the dielectric layer. A second and final mask step is then used to define the upper electrode layer of the DRAM capacitor.

Consequently, the process requires two mask steps to fabricate a DRAM capacitor. The embodiment employs a self aligned capacitor container fabrication process that exploits the use of a wide variety of materials in a multilayer structure. The capability of performing sequential etchings through this multilayer structure minimizes overetching through the word line spacers, which might otherwise cause short circuits between the gate and bottom electrode.

These and other objects and advantages of the present invention will become fully apparent from the following description taken in conjunction with the accompanying drawings.

BRIEF DESCRIPTION OF THE INVENTION

DETAILED DESCRIPTION OF THE PREFERRED EMBODIMENT

Figure 1:
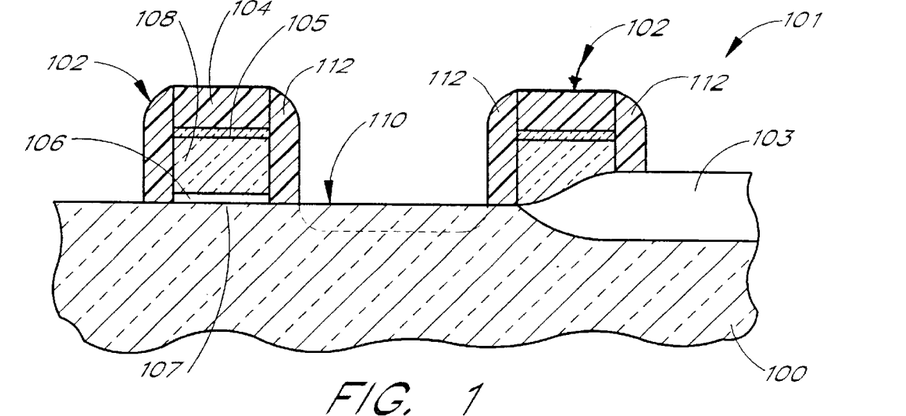
FIG. 1 is a schematic section of a partially fabricated integrated circuit, wherein gate electrodes have been formed over a semiconductor substrate.

Reference will now be made to the drawings wherein like numerals refer to like parts throughout. FIG. 1 shows a silicon wafer 101 having a substrate 100 which has been processed to a point where capacitor fabrication begins. At this stage of the fabrication process, an exemplary pair of gate structures 102 (word lines for a DRAM cell) and a doped active area 110 are formed on the silicon substrate 100, which preferably comprises monocrystalline silicon. It will be understood by one of skill in the art of semiconductor processing, however, that the "substrate" in alternative embodiments may comprise other forms of semiconductor layers which include active or operable portions of semiconductor devices. The active area 110 forms part of an active field effect transistor which will serve as an access transistor in the DRAM cell. The active area 110 is isolated from other active areas in a DRAM array by a thick field oxide 103 and one of the word lines 102 is positioned over this field oxide region 103.

As shown in FIG. 1, the word line structure 102 may, for example, comprise a first silicon oxide ("oxide") layer 106 formed on the substrate 100, a layer of polycrystalline silicon (polysilicon or simply "poly") 108 formed on the top of the first oxide layer 106, a refractory material layer 105 formed on the top of the poly layer, a horizontal spacer layer 104 formed on the top of the refractory layer 105 and a pair of sidewall spacers 112 formed vertically along the side walls of the word lines 102. The spacers 104 and 112 in the prior art have been formed from silicon nitride and are used to protect the word lines 102 from the etchants used to expose the active area 110. The spacers 104 and 112 also act as a shield during the various implantation steps to prevent dopant atoms from entering a channel region 107 of the substrate 100 positioned under the gate structure 102 Further, during the operation of the DRAM cell, these spacers 104 and 112 provide electrical isolation between the gate electrode 108 and the active area 110. Each of the components of the word lines 102 may be formed using known processes and materials.

As discussed above, despite its many disadvantages as a spacer material, conventional self-aligned processes almost invariably use nitride as a spacer material due to required etching selectivity for the process. However, as will be understood from the following discussion, the self-aligned fabrication technique presented in this embodiment does not necessarily require nitride as a spacer material. In fact, in the preferred embodiment, silicon dioxide is used as the material for the sidewall spacers 112. A silicon dioxide sidewall spacer 112 is preferably deposited using a chemical vapor deposited (CVD) tetraethoxysilane (TEOS) oxide deposition which occurs by decomposing a TEOS compound at a temperature near 700° C. As mentioned above, silicon oxide has many advantages over nitride spacers, such as less stress induction, and processing advantages, e.g., lower temperature deposition and better step coverage.

Figure 2:
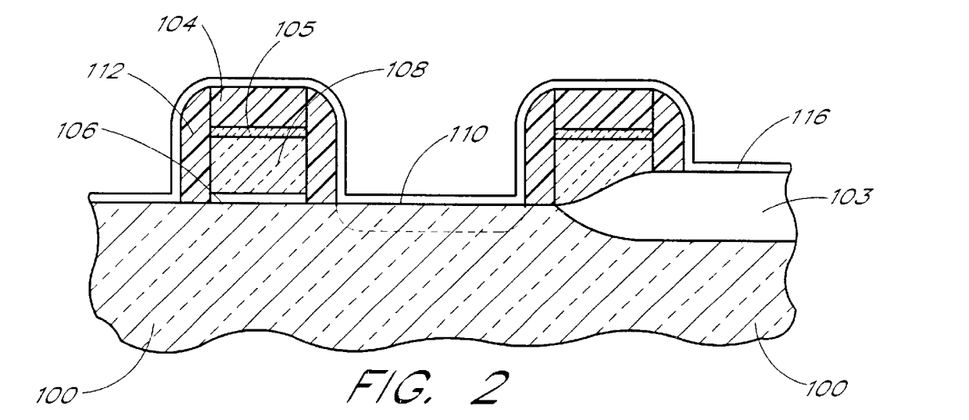
FIG. 2 is a schematic view of the wafer shown in FIG. 1, wherein an etch stop layer has been deposited over the gates and substrate.

As illustrated in FIG. 2, a conformal layer of a suitable material is deposited on the structure shown in FIG. 1, thus forming an etch stop layer 116. The etch stop layer 116 is comprised of a continuous thin film of substantially uniform thickness covering the exposed surfaces of the wafer 101. Preferably, the etch stop layer 116 comprises a layer of silicon dioxide. Preferably, the etch stop layer 116 is between about 25 Å and 5,000 Å, more preferably between about 50 Å and 2,000 Å, and most preferably about 100–200 Å. "Substantially uniform" refers to a thickness which varies by no more than about ±20% of the average layer thickness, particularly within the contact area. Preferably, the thickness varies by no more than about ±10% and more preferably, the thickness is uniform within about ±2–3%. In contrast to the prior art self-aligned processes, the preferred embodiment employs this etch stop layer 116 to protect the word lines 102, active areas 110 and field oxide regions 103 from the unwanted over-etching occurring during the self-aligned process.

Figure 3:
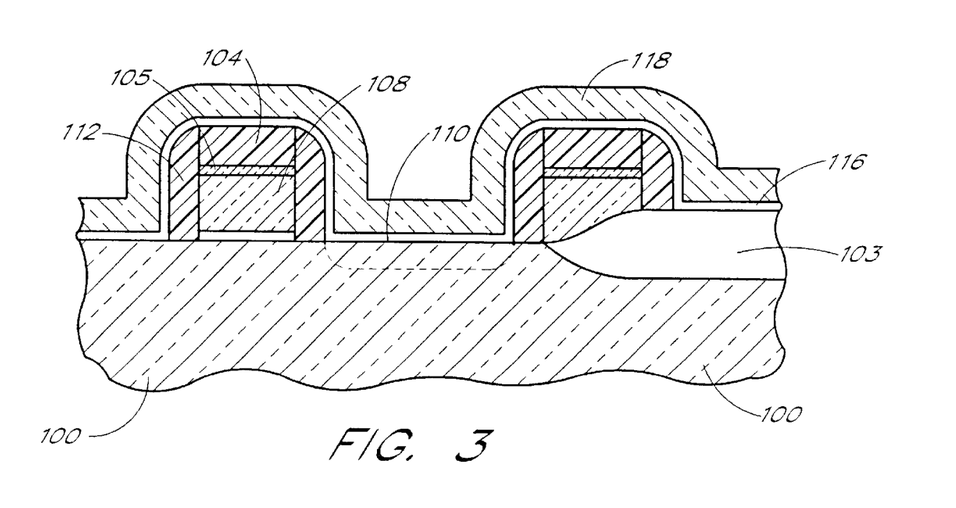
FIG. 3 is a schematic view of the wafer shown in FIG. 2, wherein a sacrificial layer has been deposited over the etch stop layer.

As illustrated in FIG. 3, following the etch stop layer deposition, a sacrificial layer 118 is deposited on top of the etch stop layer 116. This sacrificial layer 118 forms a buffer layer between the initially deposited etch stop layer 116 and the subsequently deposited layers. The sacrificial layer 118 is comprised of a continuous thick film covering the etch stop layer 116. In the preferred embodiment, the sacrificial layer 118 comprises a layer of polycrystalline silicon (polysilicon). This polysilicon layer can be deposited using any of a number of polysilicon deposition techniques well-known in the art.

As will be understood from the following processing steps, the sacrificial layer 118 should be selectively etchable relative to the thin etch stop layer 116. Preferably, the sacrificial layer can be etched with greater than about 10:1 selectivity relative to the etch stop layer 116, i.e., the sacrificial layer 118 can be etched at ten times the rate of the etch stop layer 116. In this respect, other material such as a layer of titanium nitride (TiN) can also be used to form this sacrificial passivation layer. TiN can also be etched selectively relative to the preferred silicon dioxide etch-stop layer. In the preferred embodiment, a CVD technique can be used to deposit the polysilicon layer 118. In particular, CVD polysilicon is preferably deposited by pyrolizing silane compound ($SiH_4$) at about 600° C. The polysilicon layer may be conductively doped during or after the deposition. However, as conductivity is not important in the sacrificial layer function, the preferred sacrificial layer 118 is left undoped.

As opposed to prior art applications, the use of this intermediate sacrificial layer 118 in the self-aligned contact opening process provides many advantages over prior art applications. One of the advantages is that this sacrificial layer 118 provides the opportunity of using many alternative materials for the etch stop and mask layers, and particularly for the gate spacer materials. As described in more detail below, the etch selectivity of the process may be improved to prevent damage to the word line spacers 104, 112. At the same time a wider selection of materials is available for the spacers, as well as for the other components. Additionally, the preferred polysilicon sacrificial layer 118 may reduce stress during the process and thereby reduce defects in various layers, which defects might otherwise cause current leakage, etch rate nonuniformities, etc.

Figure 4:
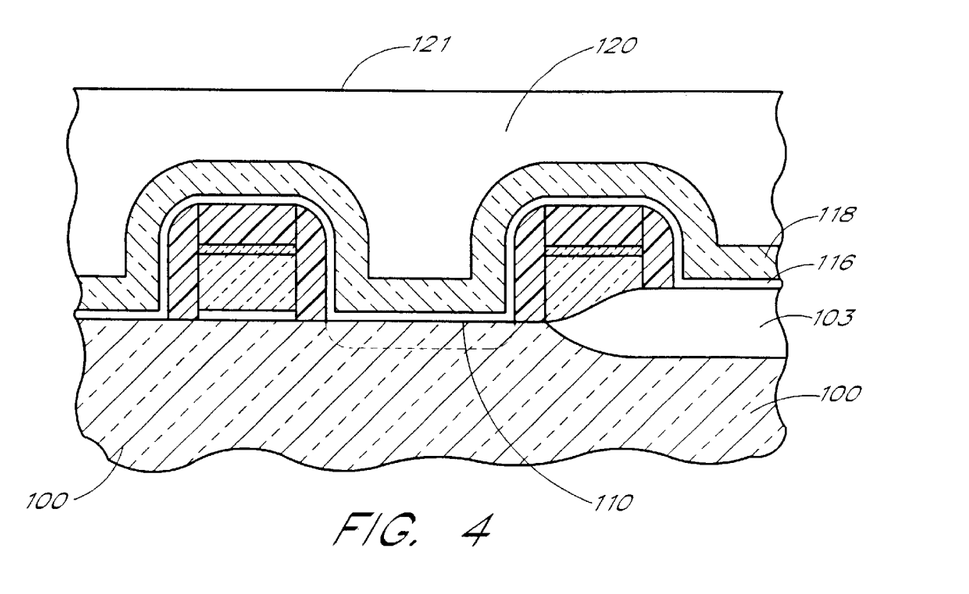
FIG. 4 is a schematic view of the wafer shown in FIG. 3, wherein a layer of borophosphosilicate glass (BPSG) has been deposited over the sacrificial layer.

FIG. 4 illustrates that, once the sacrificial layer 118 is formed over the etch stop layer 116, a masking layer 120 (hard mask) is preferably deposited on top of the wafer 101. The masking layer 120 is deposited and planarized to a selected thickness sufficient to fill all the gaps between the adjacent word lines 102 and to coat the word lines so as to provide a planar upper surface 121 on the wafer 101. As will be understood in the following processing steps, the masking layer 120 may or may not be selectively etchable relative to the sacrificial layer 118. In the preferred embodiment, wherein the sacrificial layer 118 comprises silicon, the masking material 120 preferably comprises borophosphosilicate glass (BPSG). A spin-on application technique may be used to deposit the BPSG layer 120 over the wafer 101. As will be understood in the following processing steps, the masking layer 120 serves as a structural layer in which a container shape is created for forming a container-shaped capacitor. The container is formed by patterning and etching a self-aligned contact opening to reach the active area 110.

Figure 5:
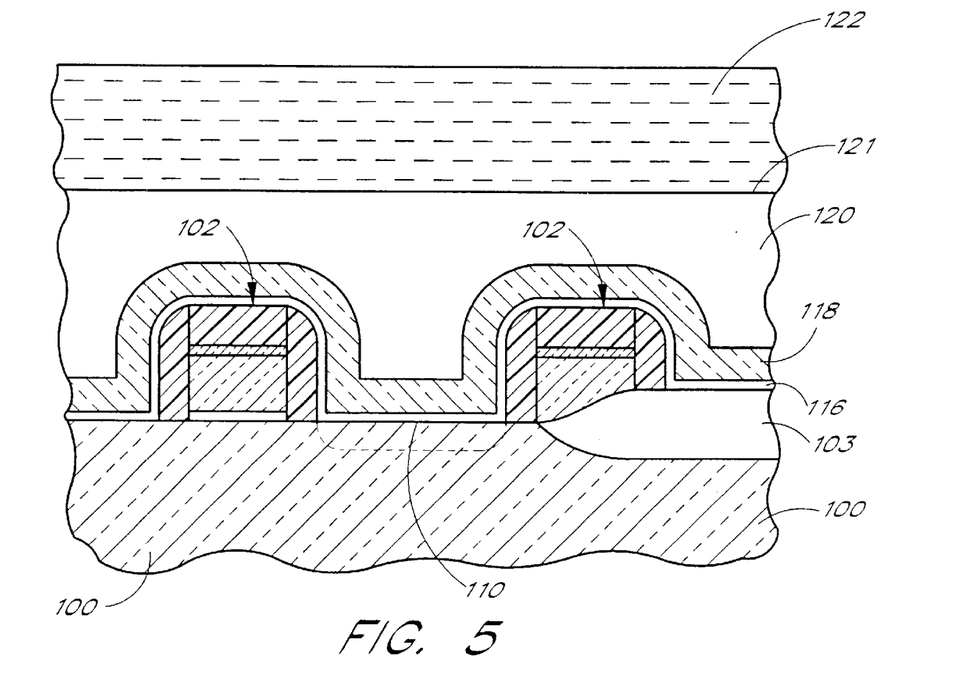
FIG. 5 is a schematic view of the wafer shown in FIG. 4, wherein a layer of photoresist has been deposited on top of the BPSG layer.
Figure 6:
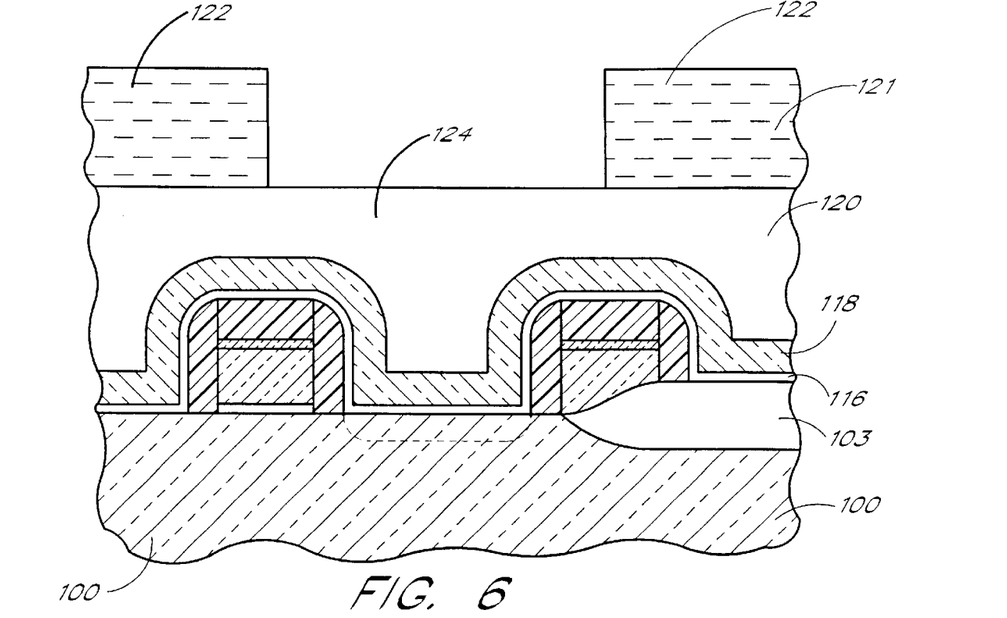
FIG. 6 is a schematic view of the wafer shown in FIG. 5, wherein the photoresist has been patterned to form a resist pattern mask on the BPSG layer.

As illustrated in FIG. 5, a layer of photoresist mask material 122 is then deposited on the planar surface 121 on top of the BPSG hard-mask layer 120. This photoresist layer 122 is preferably comprised of a light-sensitive photoresist and can be deposited using any of a number of well-known techniques in the art. In the next step, this photoresist layer 122 is patterned using a first pattern mask (not shown) to define a contact opening pattern on the photoresist. Specifically, a pattern mask contains the pattern of the devices to be fabricated. Exposure of the resist coated wafer 101 to ultraviolet light through this pattern mask can harden or soften parts of the resist layer 122. The softened parts of the resist layer 122 are later stripped and thereby form the first mask (lithographic mask) on the BPSG layer 120. This first patterning step can be carried out using any of a number of well known techniques in the art. As illustrated in FIG. 6, after patterning the photoresist 122 with the first pattern mask, portions of the photoresist layer 122 still mask the underlying portions of the BPSG layer 120 while a contact portion 124 of the BPSG layer 120 is exposed to define a contact opening pattern on the BPSG layer 120.

Figure 7:
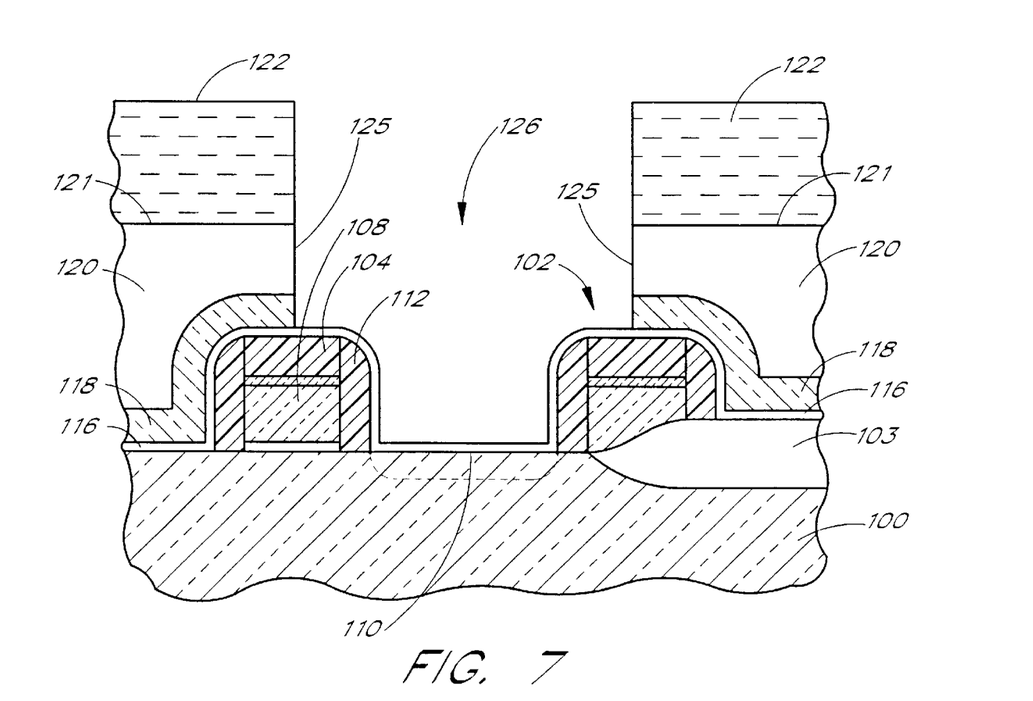
FIG. 7 is a schematic view of the wafer shown in FIG. 6, wherein a selective etch process has been performed through the BPSG and sacrificial layers form a self-aligned capacitor container region above the active area.

As illustrated in FIG. 7, after patterning the photoresist 122 over the BPSG layer, an etch or a sequence of etching steps are conducted to open a contact hole 126 down to the etch stop 116 through the defined area 124 on the BPSG layer 120. The contact hole 126 is defined by layer sidewalls 125, which will also define the capacitor's container shape. During the etching process, a first dry etch step is preferably applied to selectively etch the BPSG layer 120 relative to the remaining photoresist 122. Preferably, a second etch step (dry or wet) is then conducted to selectively etch the sacrificial layer 118 relative to the thin etch stop layer 116. While the mask layer etch may be selective or timed, at least the sacrificial layer etch should be highly selective to the underlying etch stop layer 116. In fact, the preferred materials (polysilicon sacrificial layer and oxide etch stop) are chosen to enable a selective etch, though other combinations of materials are also possible. Preferred etch processes include fluorine etches (e.g., with $CF_4$ or $CHF_3$). After etching the BPSG 120, the polysilicon sacrificial layer 118 is then selectively etched relative to the etch stop 116, preferably with greater than about 10:1 selectivity. Polysilicon can be dry etched using HBr and $Cl_2$ plasma, for example.

Figure 8:
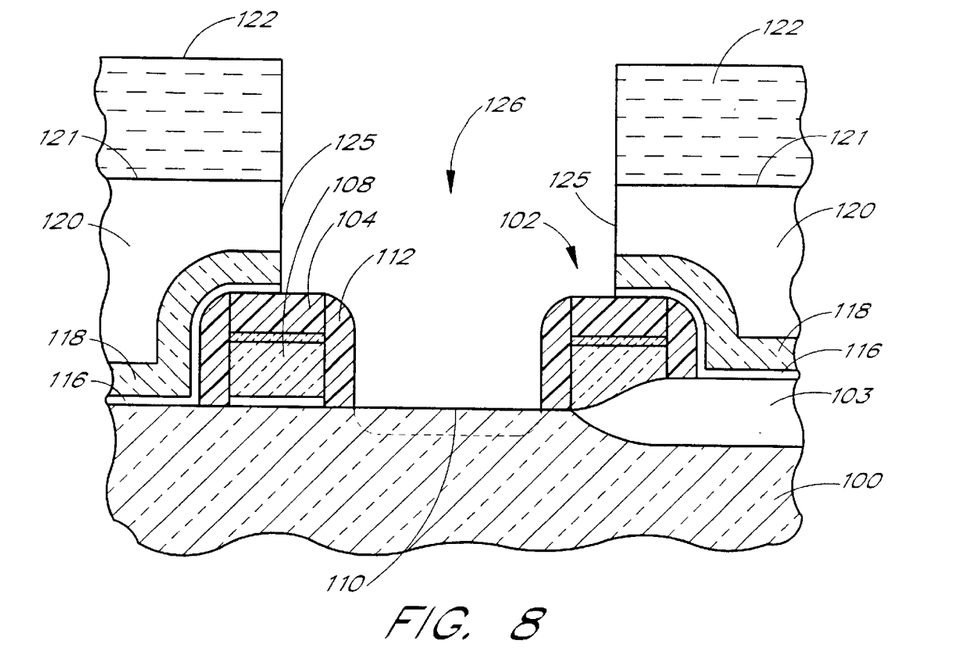
FIG. 8 is a schematic view of the wafer of FIG. 7, wherein a contact has been opened through the etch stop layer.

FIG. 8 illustrates the product of an etch stop removal step. Preferably, a timed dry etch step is conducted to etch the etch stop layer 116 from the contact opening 126 to expose the active area 110 and to partially expose the word lines 102.

Due to the substantial uniformity in thickness of the etch stop layer 116, this removal step need not be highly selective. Rather, carefully timing the etch ensures minimal damage to the underlying top 104 and sidewall spacers 112 and active area 110. Preferably, however, damage is minimized by a combination of selectively etching the etch stop layer 116 relative to the active area 110, while also timing the etch. As with BPSG, the oxide of the preferred etch stop layer 116 can be etched using fluorine chemistry (e.g., with $CF_4$ or $CHF_3$).

Figure 9:
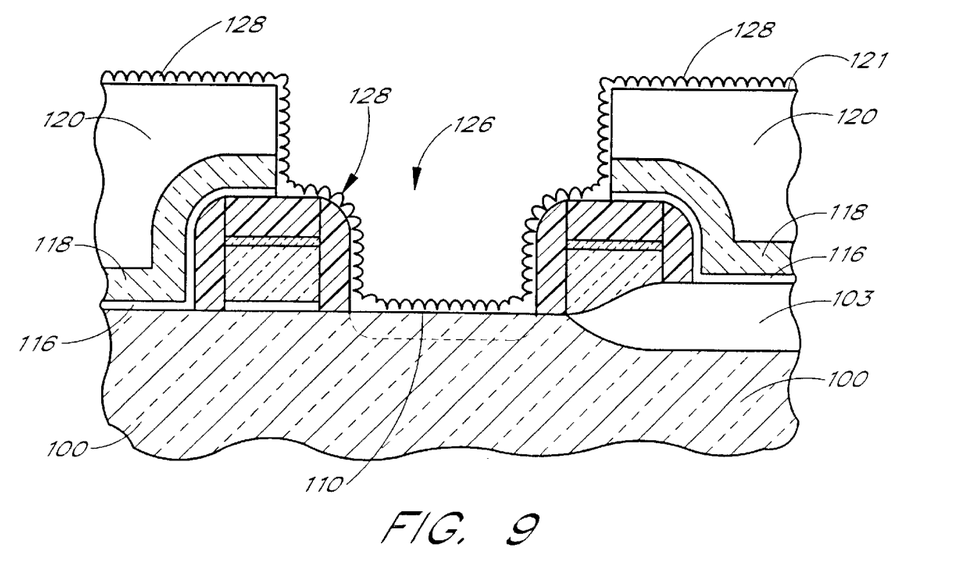
FIG. 9 is a schematic view of the wafer shown in FIG. 8, wherein the photoresist mask has been stripped from the remaining portions of the BPSG layer and wherein a layer of hemispherical grain conductive polysilicon (HSG) has been deposited on top of the wafer.

As, illustrated in FIG. 9, following the removal of the remaining photoresist 122, a first conducting layer 128 is conformally deposited over the wafer 101. This layer forms the storage plate or bottom electrode of the future capacitor and is preferably comprised of an in-situ doped hemispherical grain polysilicon (HSG). As is well-known in the art, HSG is a type of polysilicon having a rough textured surface which yields increased capacitance. The HSG layer 128 conforms to the walls 125 of the capacitor container 126, including the exposed surfaces of the spacers 104, 112 and the active area 110, as well as the top of the remaining portions of the BPSG layer. 120. Since the first conductive layer 128 is directly laid over the active area 110, the capacitor bottom electrode will electrically contact the active area 110 without requiring any contact plug. Prior art container capacitors have generally been electrically connected to the active area through a polysilicon plug, which requires an additional patterning and photolithographic step (one to define the storage plate and one for the poly plug). However, because the novel process leaves the gate electrode spacers 104, 112 intact to adequately isolate the gate electrode 108, this embodiment does not require a poly plug formation, thereby eliminating at least one photolithographic or masking step.

Figure 10:
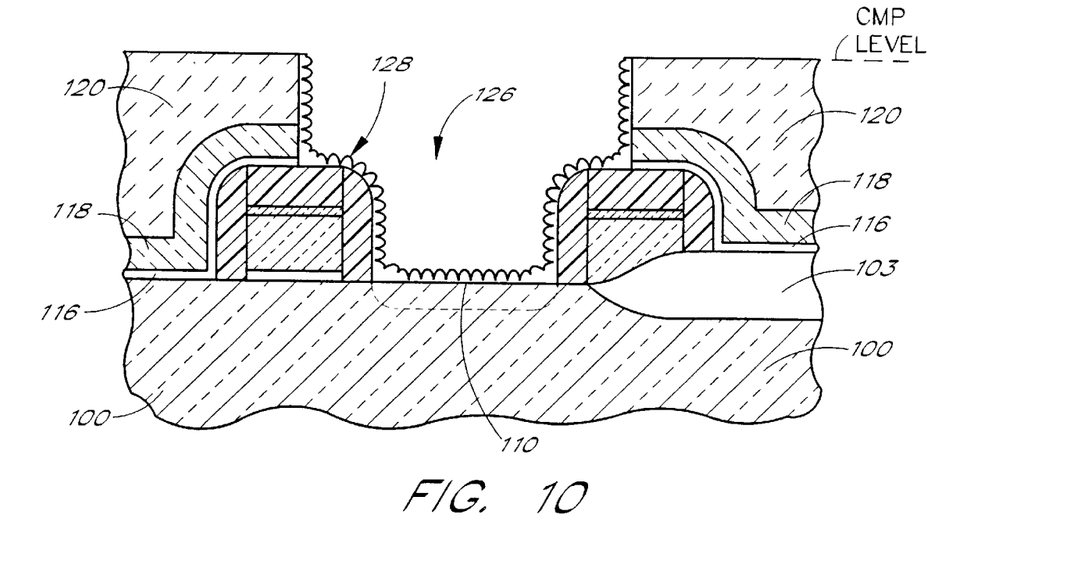
FIG. 10 is a schematic view of the wafer shown in FIG. 9, wherein the HSG layer has been planarized to define the bottom electrode of the capacitor.

As illustrated in FIG. 10, after the deposition of the HSG layer 128, the portion of the HSG layer 128 covering the top of the portions of the BPSG mask layer 120 is stripped away, preferably by a planarization technique to define the capacitor storage plate. The planarization process produces a plane surface by mechanical abrasion, which is often referred to as mechanical planarization. In mechanical planarization, the actual material removal is done by fine abrasive particles which are partly embedded in a surface of a pad. During the mechanical planarization, in general, structures to be planarized are mounted on a fixture and pressed against the pad under pressure while being rotated relative to the pad.

Mechanical planarization may also be aided by chemical reactions. This type of planarization process is known as chemical mechanical planarization.(CMP). In general, CMP processes involve an absorbant pad with a controlled amount of abrasive slurry, which combines mechanical abrasion with chemical reactions in removing the layers. A CMP slurry is generally a colloidal suspension of fine abrasive particles, such as silica particles, in an aqueous solution of chemical etchants, such as potassium hydroxide (KOH) or ammonium hydroxide (NH₄OH). Preferably, a CMP process removes the top portions of the HSG layer 128, thus exposing the underlying BPSG 120.

At this point of the process, the use of CMP techniques provides many advantages, such as a reduced number of process steps which results in fewer defect formations, lower cost and manufacturing time. Alternatively, the same HSG removal can be carried out either using a photolithographic (mask) step or a conventional etch process requiring four process steps, as opposed to the single process step using CMP. This alternative etch process to isolate various bottom electrodes in any alternative array may comprise the steps of depositing a photoresist layer over the wafer 101, exposing and developing the photoresist to leave resist only in the container (opening) 126, etching the HSG over the BPSG portions 120 and stripping off the remaining photoresist.

Figure 11:
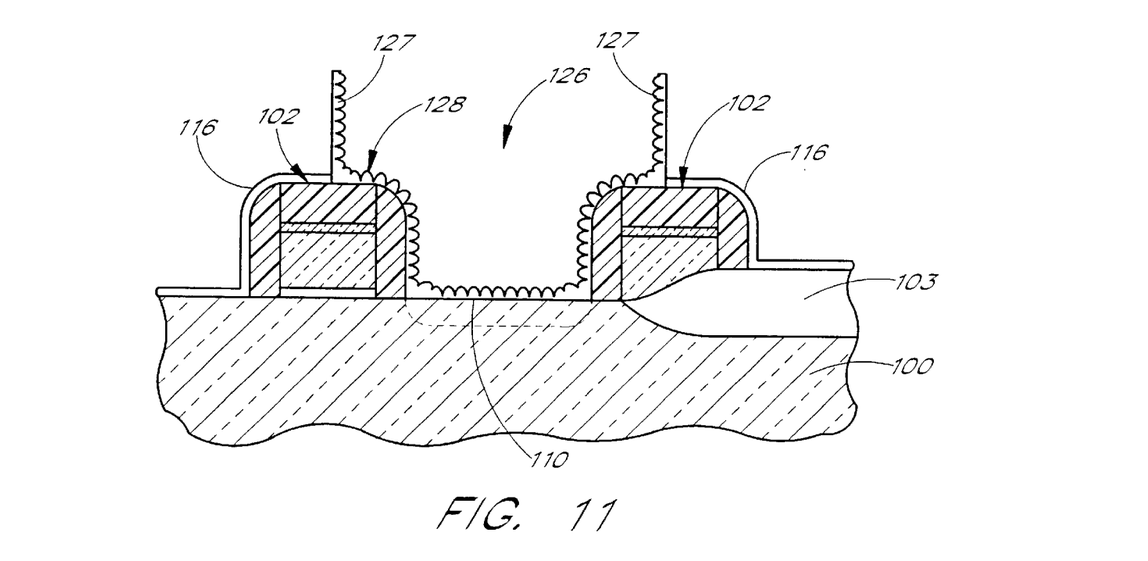
FIG. 11 is a schematic view of the wafer shown in FIG. 10, wherein the remaining portions of the BPSG layer and the polysilicon layer have been etched to enlarge the surface of the storage electrode layer and to expose the remaining portions of the silicon oxide layer.

As illustrated in FIG. 11, following the CMP step, further selective etching is preferably carried out to etch the remaining BPSG layer 120 and the polysilicon sacrificial layer 118 until the remaining portions of the thin etch stop layer 116 are exposed. Once this etch step is completed, the wall portions 127 of the HSG storage plate 128 are exposed on both sides, which significantly increases the surface area of the storage plate 128 and thereby increasing the charge storage capability of the future capacitor.

Figure 12:
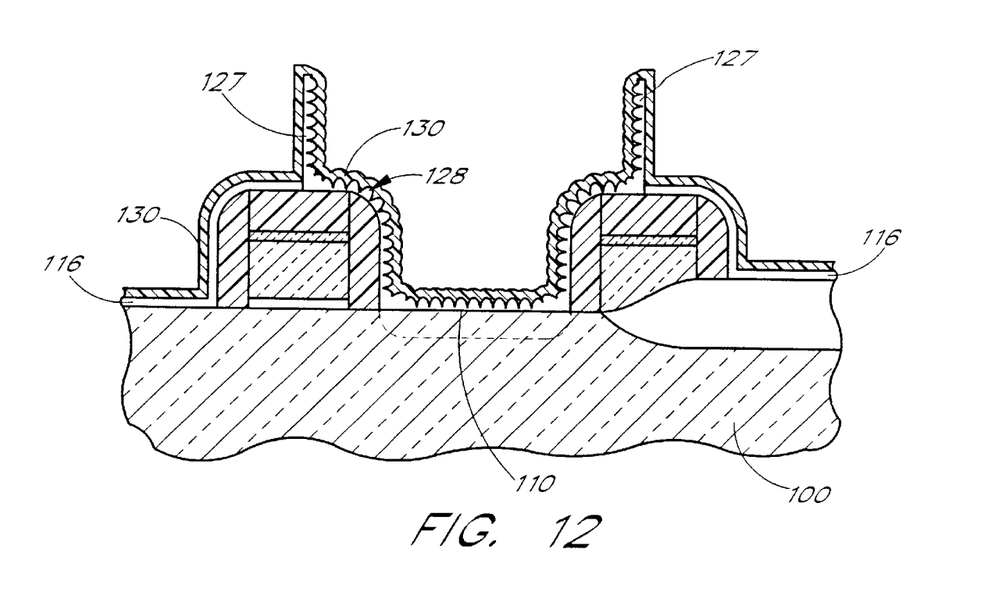
FIG. 12 is a schematic view of the wafer shown in FIG. 11, wherein a layer of silicon nitride has been deposited on top of the wafer.
Figure 13:
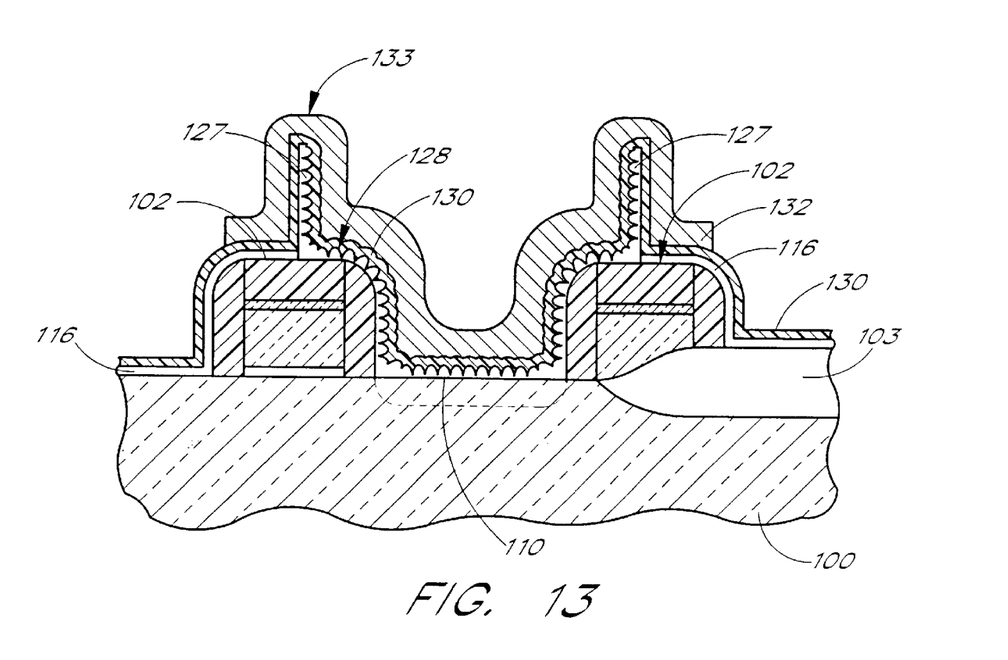
FIG. 13 is a schematic view of the wafer shown in FIG. 12, wherein a layer of conductive polysilicon has been deposited and defined to form the upper electrode of the capacitor.

As illustrated in FIG. 12, following the formation of storage plate layer, a layer of dielectric material 130 is deposited to uniformly cover the storage plate layer 128 and the remaining portions of the etch stop layer 116. This dielectric layer forms the capacitor dielectric, often referred to as the cell dielectric. The cell dielectric is preferably comprised of silicon nitride and can be deposited using any of a number of techniques in the art As illustrated in FIG. 13, after the deposition of the cell dielectric 130, a second conducting layer 132 is deposited over the cell dielectric 130. This layer forms the upper electrode of the capacitor and is preferably comprised of an in situ doped polysilicon which is deposited using any of a number of well-known techniques in the art. Following the deposition of this polysilicon layer 132, a second (final) masking step may be optionally performed to define the reference plate or upper electrode 133. Alternatively, some circuit designs may provide for a common reference electrode across a memory array. The second mask is patterned using a second pattern-mask (not shown). The patterning and definition of the upper electrode can be performed using any of a number of techniques well-known in the art. This second photolithographic step and the following etch process forms the reference plate layer 133 over the dielectric 130 which finalizes the capacitor construction. Following the construction of the capacitor, the rest of the manufacturing flow may proceed by conventional process steps.

It will be understood that the improved DRAM capacitor manufacturing process provided by the present invention requires only two masking steps as opposed to three steps in the prior art. The process employs a self-aligned contact opening process that exploits the use of a wide variety of materials. In contrast to the conventional self-aligned processes, the capability of performing sequential selective etchings through the multilayer structure of the BPSG and the polysilicon passivation layer, as well as the etch stop layer, minimizes the over-etching of the word-line spacers in ULSI DRAM structures.

Hence, although the foregoing description of the preferred embodiment of the present invention has shown, described and pointed out the fundamental novel features of the invention, it will be understood that various omissions, substitutions, and changes in the form of the detail of the apparatus and method as illustrated as well as the uses thereof, may be made by those skilled in the art, without departing from the spirit of the present invention. Consequently, the scope of the present invention should not be limited to the foregoing discussions, but should be defined by the appended claims.

We claim:

1. A DRAM memory cell capacitor, comprising:

a hemispherically-grained container-shaped bottom electrode in direct contact with an active area of a semiconductor substrate, said bottom electrode having a sidewall which, except for said hemispherical grain, has a substantially uniform thickness throughout the region;

gate electrodes on each side of the active area of the semiconductor substrate, the gate electrodes having side spacers, one of which spacers on each electrode is covered by the hemispherically-grained electrode, another of which spacers on each electrode is covered by an etch stop layer that extends also over a portion of the semiconductor substrate, the bottom electrode sidewall extending vertically above the gate electrode from a junction with the etch stop layer, the bottom electrode defining a container for the capacitor;

a cell dielectric overlying and in direct contact with the bottom electrode and conforming to inside and outside surfaces of the bottom electrode, the cell dielectric extending over the etch stop layer; and a top electrode overlying and in direct contact with the cell dielectric and adjacent to inside and outside surfaces of the bottom electrode.

2. A bottom electrode for an integrated circuit memory cell capacitor, comprising a hemispherically-grained container-shaped bottom electrode in direct contact with an active area of a semiconductor substrate between two gate electrodes, the bottom electrode having a vertical sidewall which extends vertically above the gate electrode from a junction with an etch stop layer and, except for said hemispherical-grain, has a substantially uniform thickness throughout.

3. An integrated circuit memory array, comprising a plurality of capacitors, each having a bottom electrode in direct contact with a semiconductor substrate between word lines, an etch stop layer adjacent the bottom electrode and a capacitor dielectric directly overlying each of the etch stop layer and the bottom electrode, the etch stop layer partially covering and in direct contact with gate electrode protective spacers overlying the word lines.

4. The integrated circuit memory array of claim 3, wherein the etch stop layer is formed of silicon oxide.

5. The integrated circuit memory array of claim 4, wherein the gate electrode protective spacers are formed of silicon oxide.

6. The DRAM memory cell capacitor of claim 1 wherein the bottom electrode sidewall extending vertically above the gate electrode comprises hemispherically-grained silicon.

* * * * *